US008860425B2

(12) United States Patent
Pang et al.

(10) Patent No.: US 8,860,425 B2
(45) Date of Patent: Oct. 14, 2014

(54) DEFECT DETECTION ON CHARACTERISTICALLY CAPACITIVE CIRCUIT NODES

(75) Inventors: Liang-Teck Pang, White Plains, NY (US); William Robert Reohr, Ridgefield, CT (US); Phillip John Restle, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 13/411,068

(22) Filed: Mar. 2, 2012

(65) Prior Publication Data
US 2013/0229189 A1 Sep. 5, 2013

(51) Int. Cl.
G01R 31/14 (2006.01)

(52) U.S. Cl.
USPC ........................ 324/509; 365/185.23; 365/201

(58) Field of Classification Search
CPC ........... G01R 31/14; G11C 29/50; G11C 8/08
See application file for complete search history.

(56) References Cited

U.S. PATENT DOCUMENTS

| 5,511,126 A | 4/1996 | Westwick |
| 6,172,507 B1 | 1/2001 | Hermann |
| 6,242,936 B1 | 6/2001 | Ho et al. |
| 6,832,173 B1 | 12/2004 | Starr et al. |
| 7,268,754 B2 | 9/2007 | Tsai et al. |
| 8,120,968 B2 | 2/2012 | Roehr et al. |
| 2010/0026335 A1 | 2/2010 | Fujii et al. |

FOREIGN PATENT DOCUMENTS

| JP | 05072260 A | 3/1993 |
| JP | 10302500 A | 11/1998 |

Primary Examiner — Jermele M Hollington
(74) Attorney, Agent, or Firm — Preston J. Young, Esq.; Otterstedt, Ellenbogen & Kammer, LLP

(57) ABSTRACT

A test circuit for detecting a leakage defect in a circuit under test includes a test stimulus circuit operative to drive an otherwise defect-free, characteristically capacitive node in the circuit under test to a prescribed voltage level, and an observation circuit having at least one threshold and adapted for connection with at least one node in the circuit under test. The observation circuit is operative to detect a voltage level of the node in the circuit under test and to generate an output signal indicative of whether the voltage level of the node is less than the threshold. The voltage level of the node being less than the threshold is indicative of a first type of leakage defect, and the voltage level of the node being greater than the threshold is indicative of a second type of leakage defect.

23 Claims, 8 Drawing Sheets

DEFECT DETECTION ON CHARACTERISTICALLY CAPACITIVE CIRCUIT NODES

FIELD OF THE INVENTION

The present invention relates generally to the electrical, electronic, and computer arts, and more particularly relates to integrated circuit (IC) testing.

BACKGROUND

The IC manufacturing process, which includes IC fabrication and packaging, is not a perfect one, and defects are often introduced which prevent a manufactured IC device from working as intended. Customers have high expectations for the quality and reliability of semiconductor products, and typically only a few hundred defective parts per million (DPPM) are allowed with a lifespan of several years. Aside from defects introduced during the design phase, IC manufacturing test is primarily responsible for achieving this daunting reliability objective.

Several types of testing are performed at different stages of the IC manufacturing process. For one testing type, automatic test-pattern generation (ATPG) techniques are utilized to achieve sufficient defect coverage during the wafer and final test stages of the IC manufacturing process. As IC technology advances, test patterns, in addition to the traditional stuck-at vectors, that target delay faults and various other kinds of subtle errors (e.g., latent or hidden defects), including, but not limited to, signal integrity faults, also become essential to guarantee test quality. The associated large number of test patterns not only requires considerable testing time on automatic test equipment (ATE), which is costly, but also indirectly results in more false rejections and thus lowers the manufacturing yield of the integrated circuits.

On the other hand, accelerated testing methods, such as, for example, burn-in testing, are often used to screen and discard those ICs with early-life failures (e.g., infant mortality failures) to thereby enhance product reliability. For modern ICs fabricated with the latest technology, however, it is becoming increasingly challenging to formulate and control appropriate stress conditions for the ICs during the burn-in process, which undesirably makes such accelerated testing methods a bottleneck in the manufacturing test process.

SUMMARY

Advantageously, aspects of the present invention provide a mechanism for enhancing the discovery of otherwise difficult-to-detect defects in an analog or digital circuit. To accomplish this, illustrative embodiments of the invention beneficially provide a test arrangement and/or method wherein a characteristically capacitive circuit node in the circuit under test is weakly driven above and below a prescribed switching threshold. If the isolated circuit node does not respond to the deliberately weak test stimulus, then the circuit is considered defective.

In accordance with one embodiment of the invention, a test circuit for detecting a leakage defect in a circuit under test includes a test stimulus circuit operative to drive an otherwise defect-free, characteristically capacitive node in the circuit under test to a prescribed voltage level, and an observation circuit having at least one threshold and adapted for connection with at least one node in the circuit under test. The observation circuit is operative to detect a voltage level of the node in the circuit under test and to generate an output signal indicative of whether or not the voltage level of the node is less than the threshold. The voltage level of the node in the circuit under test being less than the threshold is indicative of a first type of leakage defect, and the voltage level of the node being greater than the threshold is indicative of a second type of leakage defect.

In accordance with another embodiment of the invention, an integrated circuit including one or more test circuits for detecting leakage defects in corresponding circuits under test is provided. Each of at least a subset of the one or more test circuits includes a test stimulus circuit operative to drive an otherwise defect-free, characteristically capacitive node in the circuit under test to a prescribed voltage level, and an observation circuit having at least one threshold and adapted for connection with at least one node in the circuit under test. The observation circuit is operative to detect a voltage level of the at least one node in the circuit under test and to generate an output signal indicative of whether the voltage level of the at least one node is less than (or greater than) the threshold. The voltage level of the node in the circuit under test being less than the threshold is indicative of a first type of leakage defect, and the voltage level of the node being greater than the threshold is indicative of a second type of leakage defect.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
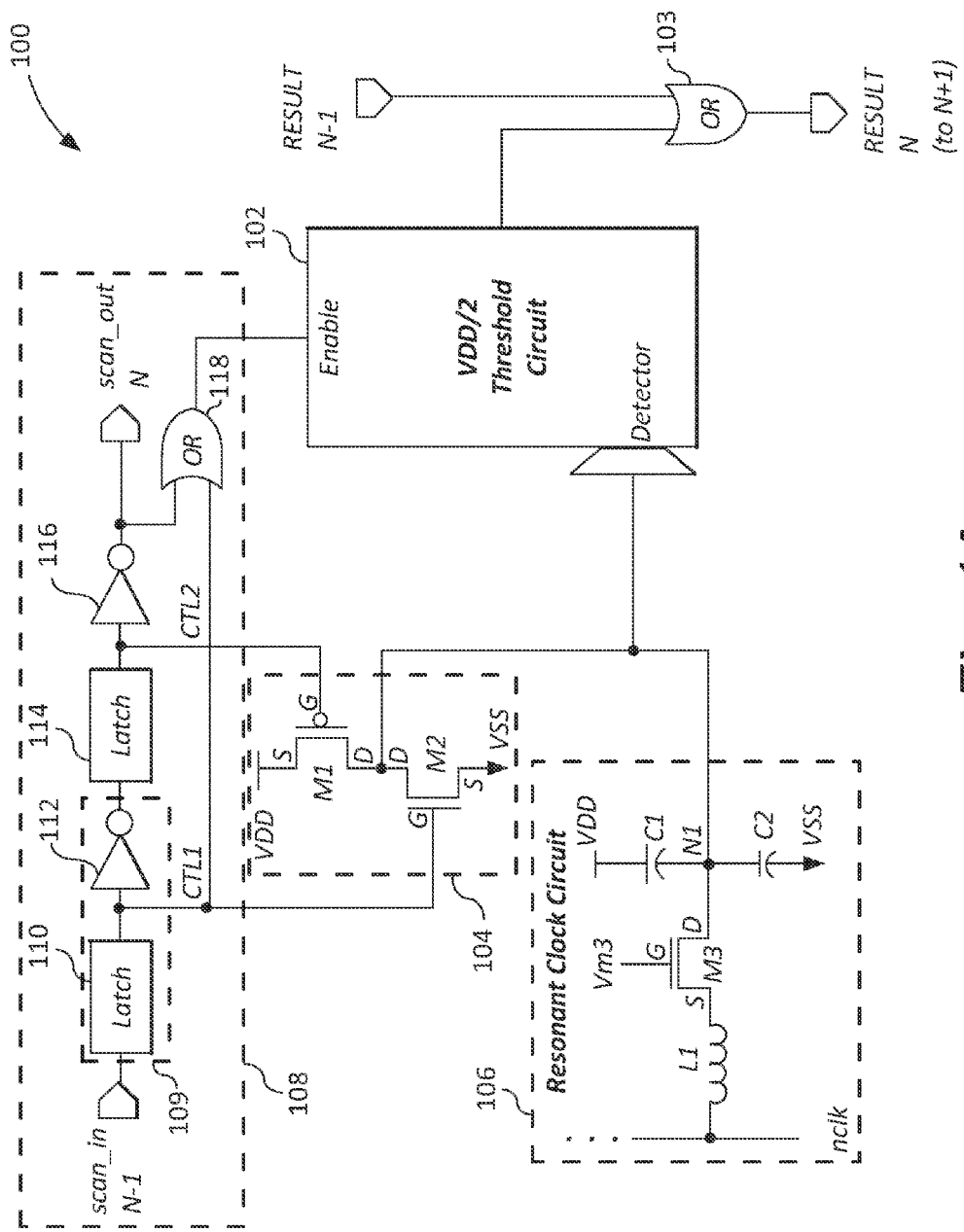
FIG. 1A is a schematic diagram depicting at least a portion of an exemplary test circuit, according to an embodiment of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Aspects of the present invention will be described herein in the context of illustrative test circuits and testing methods for detecting defects on characteristically capacitive nodes in an analog or digital circuit. To accomplish this, illustrative embodiments of the invention beneficially provide a test mechanism wherein a primarily capacitive node in the circuit under test is weakly driven above and below a prescribed switching threshold. If the isolated circuit node does not respond to the deliberately weak test stimulus, then the circuit is considered defective.

It is to be appreciated, however, that the invention is not limited to the specific circuits and/or methods illustratively shown and described herein. Rather, embodiments of the invention are directed broadly to techniques for detecting defects in analog or digital circuits which would otherwise be difficult to discover using conventional means. In this manner, testing efficiency and circuit reliability are significantly improved compared to traditional testing approaches. Moreover, it will become apparent to those skilled in the art given the teachings herein that numerous modifications can be made to the embodiments shown that are within the scope of the present invention. That is, no limitations with respect to the specific embodiments described herein are intended or should be inferred.

For the purpose of describing and claiming aspects of the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., metal-oxide-semiconductor field effect transistors (MOSFETs)), as well as those that do not. In addition, despite a reference to the term "metal" in the acronym MISFET, the term MISFET is also intended to encompass semiconductor field effect transistors wherein the gate is formed from a non-metal, such as, for instance, polysilicon.

Although implementations of the present invention described herein may be implemented using p-channel MISFETs (hereinafter called "PFETs" or "PMOS" devices) and n-channel MISFETs (hereinafter called "NFETs" or "NMOS" devices), as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

FIG. 1A is a schematic diagram depicting at least a portion of an exemplary test circuit 100, according to an embodiment of the invention. As will be described in further detail below, the exemplary test circuit 100 is operative to beneficially transform a defect associated with a characteristically capacitive node in an analog or digital circuit (e.g., a leakage defect) that is otherwise difficult to detect, into a defect (e.g., a "stuck-at" fault) that can be easily detected through traditional testing means, such as, for example, level-sensitive scan design (LSSD) testing.

With reference to FIG. 1A, test circuit 100 includes a threshold detection circuit 102, or alternative monitoring circuit, and a driver circuit 104, or alternative stimulus circuit, coupled with the detection circuit 102. The threshold detection circuit 102 includes a signal input (Detector) which is adapted for connection with a node (N1) to be monitored in a circuit under test, which in this illustrative embodiment is a resonant clock circuit 106. It is to be appreciated, however, that the invention is not limited to any specific circuit(s) under test. The threshold detection circuit 102 further includes a control input (Enable) which is adapted to receive a control signal generated, in this embodiment, by a signal generator 108 included in the test circuit 100. The threshold detection circuit 102 is operative to monitor a voltage level of node N1 and to generate an output signal indicative of whether or not the voltage on node N1 is less than a prescribed threshold level. The driver circuit 104 is adapted for connection with the node N1 to be monitored and is operative to generate a test stimulus for driving node N1 to a prescribed voltage level during a test mode of operation of the test circuit 100.

The threshold detection circuit 102 functions essentially as a comparator operative to compare an input signal supplied to the Detector input (node N1 to be monitored) with a prescribed threshold level, and to generate the output signal indicative of whether or not the input signal is less than (or greater than) the prescribed threshold level. In this embodiment, the threshold level is preferably set to one-half the supply voltage VDD (i.e., VDD/2), although the invention is not limited to any specific threshold level. A control signal supplied to the Enable input of the threshold detection circuit 102 permits the threshold detection circuit to monitor the node N1 under test. Thus, when the Enable input of the threshold detection circuit 102 is asserted, the threshold detection circuit compares the voltage on node N1 with the prescribed threshold level.

For example, when the Enable input of the threshold detection circuit 102 is asserted at a logic high (e.g., "1" or VDD), the threshold detection circuit is operative to determine whether the final voltage on the node N1 to be monitored is above or below VDD/2, thereby producing a logic low (e.g., "0" or ground) or a logic high output signal, respectively. In this embodiment, the output of the threshold detection circuit 102 remains at ground when the Enable input of the threshold detection circuit is not asserted (e.g., logic low). In accordance with alternative embodiments, the output of the threshold detection circuit 102 may be at VDD or some other voltage level (or even undefined/tri-stated) when the Enable input of the threshold detection circuit is not asserted.

It should be understood that the control input (Enable) of the threshold detection circuit 102 has been included in the exemplary embodiment for the purposes of creating a known output state of the threshold detection circuit 102 (which serves as a non-controlling input to the downstream cone of logic, as will be explained with respect to the OR gate 103, and to prevent DC current flow through FETs (not explicitly shown) in the threshold detection circuit 102 receiving a mid-level voltage (VDD–VSS)/2 from the node N1 input (Detector). In some embodiments, the control input (Enable) may not be needed, and, hence, the control input (Enable) is not an inherent feature of the threshold detection circuit 102.

It is to be appreciated that, although shown as having only a single threshold level, namely, VDD/2, threshold detection circuit 102 may, in some embodiments, include multiple threshold levels, such as, for example, an upper threshold (e.g., 3VDD/4) and a lower threshold (e.g., VDD/4), as will become apparent to those skilled in the art given the teachings herein. The threshold detection circuit 102 may, according to another embodiment, comprise an analog-to-digital converter operative to generate a digital output code, or alternative output signal, which more accurately measures the voltage on node N1 in relation to one or more prescribed threshold levels. In this manner, further information about the voltage level on node N1 can be obtained, thereby providing enhanced defect detection.

The output signal generated by the threshold detection circuit 102 is preferably fed to a first input of a logical OR gate 103 which is operative to generate an output result (Result N) of the test circuit 100. A second input of the OR gate 103 is adapted to receive an output result (Result N−1) generated by an adjacent preceding test circuit (not explicitly shown) in a cascaded test circuit arrangement. This output result, Result N, may then be supplied to an adjacent succeeding test circuit (N+1) in the cascaded test circuit arrangement.

The driver circuit 104, in this embodiment, comprises a PMOS transistor M1 and an NMOS transistor M2. A source (S) of transistor M1 is adapted for connection with a first voltage supply, which may be VDD, a drain (D) of M1 is connected with the node N1 to be monitored, and a gate (G) of M1 is adapted to receive a first control signal, CTL2, supplied to the driver circuit 104. A source of transistor M2 is adapted for connection with a second voltage supply, which may be VSS or ground or an alternative voltage return of the test circuit 100, a drain of M2 is connected with the node N1 to be monitored, and a gate of M2 is adapted to receive a second control signal, CTL1. During testing, the logic states of control signals CTL1 and CTL2 may be applied concurrently as CTL1="0" and CTL2="0" (i.e., M1 "on" and M2 "off") or may be applied concurrently as CTL1="1" and CTL2="1" (i.e., M1 "off" and M2 "on"). Under normal operation, CTL1 and CTL2 are preferably set to "1" and "0," respectively. Transistors M1 and M2 are representative of pull-up and pull-down portions of the driver circuit 104, respectively. It is to be understood that alternative driver circuit implementations are similarly contemplated by the invention, including, but not limited to, parallel transistors with dedicated control latches that enable selection of a prescribed test pull-up and/or pull-down resistance, cascode (i.e., stacked) transistor arrangements, etc., as will become apparent to those skilled in the art.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

The resonant clock circuit 106, which includes the node N1 to be monitored, includes an inductor, L1, a switch, implemented in this embodiment as an NMOS transistor M3, and first and second capacitors, C1 and C2, respectively, connected in series between the voltage supplies VDD and VSS. Capacitors C1 and C2 are configured such that first terminals of C1 and C2 are connected together at node N1, a second terminal of C1 is adapted for connection with VDD, and a second terminal of C2 is adapted for connection with VSS. In this manner, when transistor M3 is enabled, capacitors C1 and C2 essentially function as a voltage source—actually a charge reservoir—that is charged by the clock signal nclk. In alternative embodiments, a single capacitor may be employed. When transistor M3 is enabled (i.e., turned on), the clock signal nclk is integrated by capacitors C1 and C2 over time, which gives rise to the equation (VDD−VGND of an nclk clock sector buffer)/2. The nclk clock sector buffer (not explicitly shown) drives the nclk node of the resonant clock circuit 106. From a small signal (i.e., AC) perspective, capacitors C1 and C2 form an AC ground at node N1.

A first node of the inductor L1 is connected with a clock distribution network, nclk, and a second node of the inductor L1 is connected with a source of transistor M3. A drain of transistor M3 is connected with the capacitors C1 and C2 at node N1, and a gate of M3 is adapted to receive a control signal, $V_{M3}$. Control signal $V_{M3}$ is preferably indicative of a mode of operation of the test circuit 100. Transistor M3 is operative to disconnect the tuned circuit, comprising the characteristically capacitive clock distribution network nclk and the inductor L1, from node N1 during a test mode of operation as a function of the control signal $V_{M3}$. The invention is not limited to any specific values for capacitors C1 and C2.

An efficient approach to reduce power consumption in a circuit is to use resonant clocking. In this approach, on-chip inductance L1 is added to the clock distribution network (nclk) and forms a resonant circuit with interconnect capacitance attributable to the clock distribution network. Specifically, the clock distribution network, which is inherently capacitive, in conjunction with the inductor L1 form a tuned circuit, whereby energy, in the form of current and voltage, moves back and forth between the capacitive clock distribution network and the inductor. This circuit can be tuned (e.g., by controlling an inductance value of L1) so that a frequency at which a processor, or other circuit to which the clock distribution network is connected, is running is substantially matched to a resonant or peak frequency of the resonant clock circuit 106. In this manner, power consumed by the network can be reduced, since the energy alternates between electric and magnetic fields rather than being dissipated as heat within FETs of the aforementioned nclk clock sector buffer circuit (not explicitly shown).

Figure 1B:
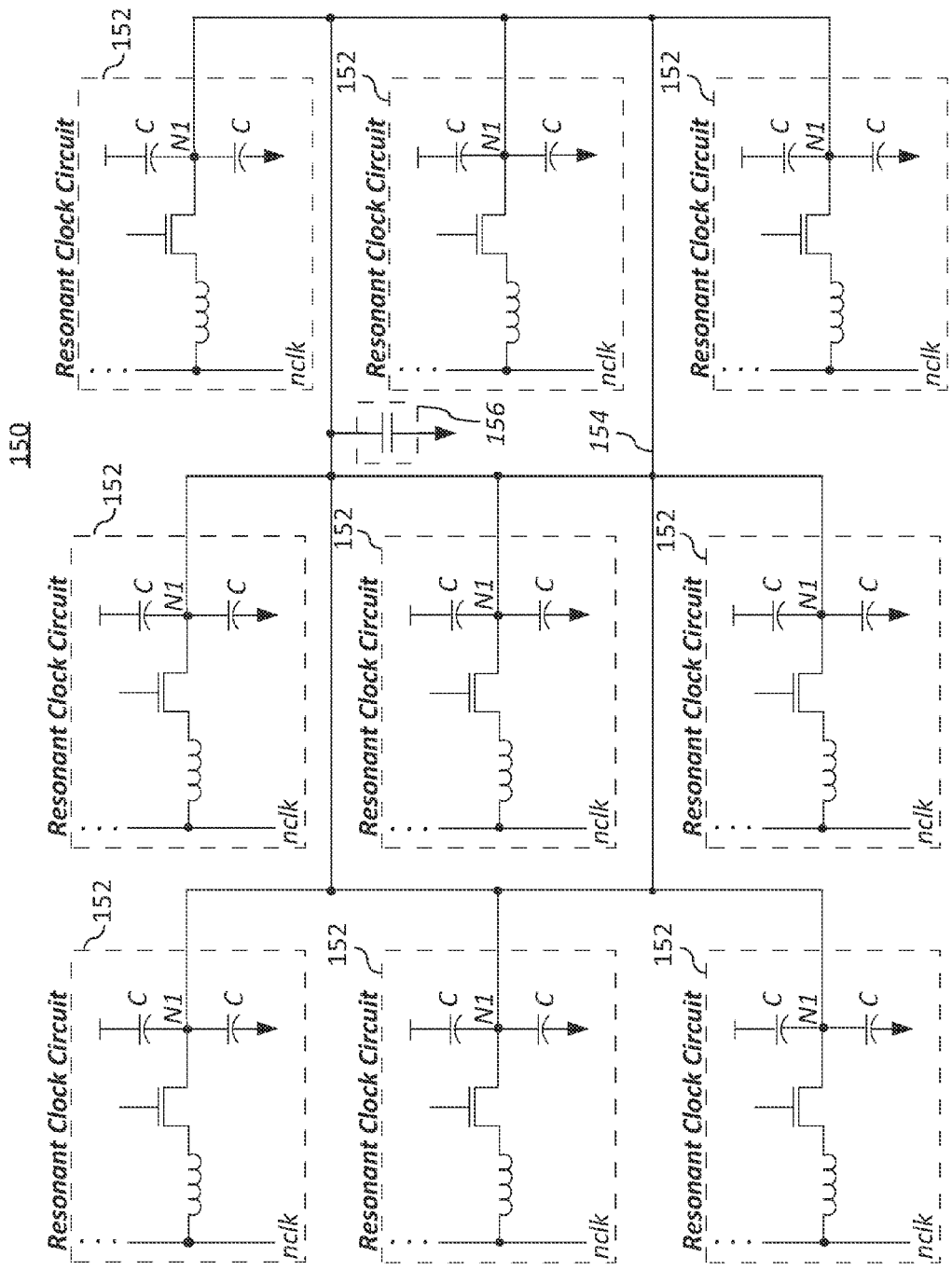
FIG. 1B is a schematic diagram depicting at least a portion of an exemplary shunting AC ground network which can be monitored using the test circuit of FIG. 1A, according to an embodiment of the invention.

FIG. 1B is a schematic diagram depicting at least a portion of an exemplary shunting AC ground network 150 including at least one circuit node to be tested using techniques of the invention. The shunting AC ground network 150 comprises a plurality of resonant clock circuits 152, each of which may be formed in a manner consistent with the resonant clock circuit 106 shown in FIG. 1A. The invention is not limited to any specific number of resonant clock circuits. The resonant clock circuits 152, which may be non-proximate relative to one another, are connected together via a connection bus 154. One or more points along the connection bus 154 can be monitored using the illustrative test circuit 100 of FIG. 1A, according to an embodiment of the invention.

Another embodiment of the invention exploits the shunting of a plurality of non-proximate resonant circuits for the purpose of improving the response of a defect-free resonant circuit during a transition from a non-resonant to a resonant mode of operation, or other circuit performance enhancements. The global resonant circuit 150 comprises a plurality of non-proximate resonant circuits 152 (circuit elements confined to a locality) having internal nodes N1 shunted together by wire 154, or an alternative connection means. Non-proximate connections may be defined, for example, as being eight times the greater of the height or width of physical dimensions of the transistor M3, although other definitions of the term "non-proximate" are similarly contemplated by the invention.

More particularly, it is contemplated that the wire 154 may aid in bringing the node N1 into DC equilibrium during a transition from a non-resonant mode of operation (e.g., transistor M3 "off," set $V_{M3}$ to "0") to a resonant operation (e.g., transistor M3 "on," set $V_{M3}$ to "1"), and may additionally, during said time, mitigate timing perturbations (and waveform perturbations) of the nclk clock signal distributed on the clock distribution mesh—the nclk node—as resonant energy is first injected into that mesh. Such improvements in the nclk signal reduce short path and long path timing hazards in registers, and the like, driven by the nclk distribution mesh.

Moreover, the global resonant clock circuit 150 further comprises one or more non-proximate capacitors 156 (with "proximity" being defined by the physical relationship of capacitors 156 to the plurality of resonant clock circuits 152) shunting wire 154 to a prescribed voltage supply (e.g., VDD or VSS). Such additional non-local capacitors permit the inclusion of capacitance in scenarios where there is little room for a capacitor of sufficient size to be located proximate to the transistor M3 in a given circuit under test. In typical IC floor plans, the resonant clock circuits 152 are located near the nclk clock sector buffer circuits. Instead, in such scenarios, non-proximate capacitors 156 are added to improve the overall charge storage capacity on node N1.

With continued reference to FIG. 1A, the signal generator 108 is operative to generate at least the first and second control signals supplied to the driver circuit 104. In this embodiment, the signal generator 108 comprises a plurality of latch stages 109 connected together in series. Each of the latch stages includes a latch coupled with a corresponding inverter, or an alternative buffer element. It is to be understood that the invention is not limited to any specific number of latch stages or inverters in the signal generator 108.

Specifically, a first latch stage (N−1) includes a first latch 110 operative to receive an input signal, scan_in N−1, either supplied to the signal generator 108 or generated as an output signal of a preceding adjacent latch stage (e.g., latch stage N−2, not shown), and a first inverter 112 having an input connected with an output of the latch 110 and operative to generate a first output signal of the first latch stage. Likewise, a second latch stage (N) includes a second latch 114 operative to receive an output signal generated by the preceding adjacent latch stage N−1, and a second inverter 116 having an input connected with an output of the latch 114 and operative to generate a second output signal, scan_out N, of the second latch stage. The first and second control signals CTL1 and CTL2, respectively, supplied to the driver circuit 104 are generated as latch output signals from corresponding adjacent latch stages. More particularly, control signal CTL1 supplied to pull-down transistor M2 is generated as an output of latch 110, and control signal CTL2 supplied to pull-up transistor M1 is generated as an output of latch 114. Additionally, the control signal supplied to the Enable input of the threshold detector circuit 102 is generated by the signal generator 108 as a logical OR (by way of logical OR gate 118) of the second output signal scan_out N and the first control signal CTL1.

The latches 110 and 114 are organized so that, when all 0's are loaded in through a scan_in input/port of a series of cascaded test circuits 100 (in a multiple test circuit arrangement)—an exemplary default state for all latches in a microprocessor—all test circuits 100 are disabled. In particular, transistor M2 is disabled by the low logic level (ground) at its gate input, transistor M1 is disabled by the high logic level (VDD) at its gate input, OR gate 118 produces a low logic level at its output which disables the threshold detection circuit 102, the output of the threshold detection circuit 102 is a low logic level, and with one input low, OR gate 103 transfers the logic state of the immediately preceding (N−1) test circuit result (Result N−1) to the output of the current test circuit 100 (i.e., Result N). During test, the test results may thus be passed through a test circuit that is not actively undergoing test. Since a non-controlling low logic level (i.e. "0") is applied to the input of the OR gate 103, the OR gate 103 acts like a non-inverting buffer passing the logic state unmodified from its input, result N−1, to its output, result N.

To invoke one test circuit 100 among a plurality of cascaded test circuits, one bit in the field of zeros is set high at the overall input to the chain of latch stages 109 (i.e., scan_in 1, not explicitly shown). When the high bit is loaded into latch 110, the threshold detection circuit 102 is enabled, and transistor M2 is also turned on. If the node N1 to be monitored is free of pull-up defects, node N1 will be pulled down to ground by transistor M2, and, hence, the output of test circuit 100 (Result N) will also be low, indicating that the resonant clock circuit 106 under test has no pull-up defects. However, if node N1 is pulled up by a defect, the output Result N will also be high, indicating the presence of a defect in the resonant clock circuit 106.

The expected results are opposite in the case when a low bit (the high bit from the scan_in chain perspective) is loaded into latch 114. The threshold detection circuit 102 is still enabled, but this time transistor M1 is turned on. If node N1 is free of pull-down defects, node N1 will be pulled up to VDD by transistor M1, and, hence, the output of test circuit 100 (Result N) will be high, indicating that the resonant clock circuit 106 under test has no pull-down defects. However, if node N1 is pulled down by a defect, the output Result N will be low, indicating the presence of a defect in the resonant clock circuit 106. In this manner, the one in the field of zeros (for latch 114, the zero is inverted to a one) is moved from latch to latch along the scan chain of cascaded test circuits 100 to excite/enable testing of all the mostly-capacitive analog circuit nodes (e.g., node N1) on a chip.

In terms of operation, given that switch transistor M3 in the resonant clock circuit 106 is turned off during test mode, transistor M2 in the driver circuit 104 is preferably operative to "weakly" drive node N1 to ground. In a functioning circuit, node N1 should be driven close to ground when transistor M2 is enabled, even weakly. In a defective circuit, however, node N1 will not be driven to ground by transistor M2 and may, instead, be driven to VDD by the presence of, for example, a pull-up defect having a pull-up strength greater than the pull-down strength of transistor M2. Thus, a drive strength of the pull-down portion of the driver circuit 104, which in this embodiment comprises transistor M2, is preferably selected to be less (i.e., weaker) than the pull-up strength associated with an anticipated pull-up defect in the resonant clock circuit 106 being tested. Drive strength can be controlled, for example, by increasing or decreasing a ratio of channel width to channel length in transistor M2, by adding or subtracting NMOS transistors in parallel with transistor M2, or by adding or subtracting NMOS transistors in series with transistor M2. Thus, by decreasing the size and/or number of NMOS transistors M2 in the driver circuit 104, the test circuit 100 is able to check for the presence of a smaller pull-up defect in the circuit 106 to be tested, and by increasing the size and/or number of NMOS transistors M2 in the driver circuit 104, the test circuit 100 is able to check for the presence of a larger pull-up defect in the circuit 106.

It is contemplated by the invention that the gates of a plurality of parallel transistors M2 may be individually controlled by a unique control signal, so that one or more of the transistors M2 may be selectively enabled, one by one or as a partial plurality or as a full plurality, to perform a parametric (more analog-like) test.

Likewise, during test mode, transistor M1 in the driver circuit 104 is preferably operative to "weakly" drive node N1 to VDD. As previously stated, switch transistor M3 in the resonant clock circuit 106 will be turned off during test mode. In a functioning circuit, node N1 should be driven close to VDD when transistor M1 is enabled, even weakly. In a defective circuit, however, node N1 will not be driven to VDD by the active transistor M1 and may, instead, be driven to ground by the presence of a pull-down defect having a pull-down strength greater than the pull-up strength of transistor M1. Thus, a drive strength of the pull-up portion of the driver circuit 104, which in this embodiment comprises transistor M1, is preferably selected so as to be less (i.e., weaker) than the pull-down strength associated with an anticipated pull-down defect in the resonant clock circuit 106 being tested. Drive strength can be controlled, for example, by increasing or decreasing a ratio of channel width to channel length in transistor M1, by adding or subtracting PMOS transistors in parallel with transistor M1, or by adding or subtracting PMOS transistors in series with transistor M1. Thus, by decreasing the size and/or number of PMOS transistors M1 in the driver circuit 104, the test circuit 100 is able to check for the presence of a smaller pull-down defect in the circuit 106 to be tested, and by increasing the size and/or number of PMOS transistors M1 in the driver circuit 104, the test circuit 100 is able to check for the presence of a larger pull-down defect in the circuit 106.

Finally, with respect to FIG. 1A, it is important to recognize that the gates of transistors M2 and M1 have been connected specifically to output nodes of latches 110 and 114, respectfully. These nodes are an integral part of the scan chain (comprising cascaded elements 110, 112, 114, 116), and thus so too are the gates of transistors M2 and M1. Given that stuck-at-0 faults (e.g., CTL1 shunted to GND) and stuck-at-1 faults (i.e., defects) can be detected within the scan chain by shifting 1's and 0's through latches 110 and 114, as is known in the art, the gates of transistors M2 and M1 are testable. If the connections to the gates of transistors M2 and M1 were, instead, outside of the scan chain, a stuck-at fault enabling one of the transistors M2 or M1 (i.e., a gate defect) may be more difficult (or impossible) to detect because its presence for test is indicated by only a weak pull-down on node N1 or a weak pull-up on node N1, respectfully.

Figure 2:
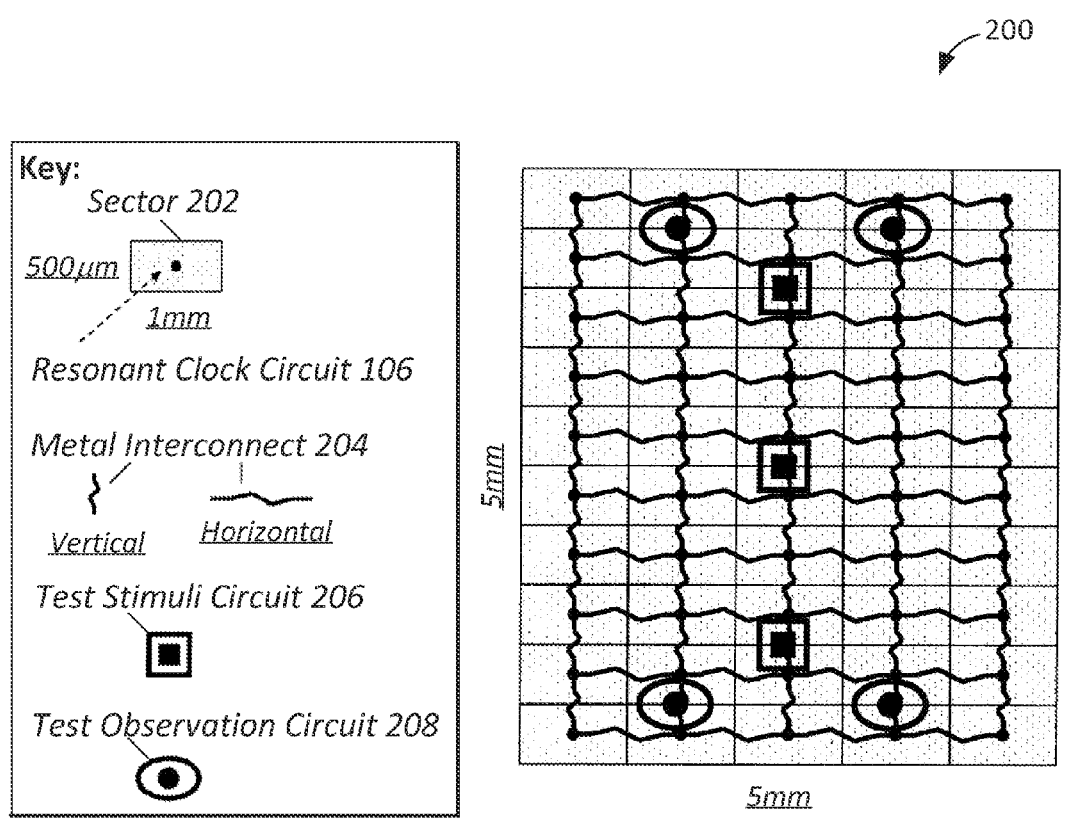
FIG. 2 is a top plan view depicting at least a portion of an illustrative integrated circuit (IC) layout, according to an embodiment of the invention.

FIG. 2 is a top plan view depicting at least a portion of an illustrative integrated circuit (IC) layout 200, according to an embodiment of the invention. The IC layout 200 conceptually depicts an exemplary placement of test circuit structures in relation to clock circuits and interconnect structures to be tested. More particularly, FIG. 2 illustrates how one or more test circuits (e.g., test circuit 100 shown in FIG. 1A) can be used to test a multiplicity of circuits to be tested (e.g., resonant clock circuit 106 shown in FIG. 1A) having their characteristically capacitive nodes (e.g., N1) to be tested shunted together through vertical and horizontal metal interconnects 204 (which, as previously explained, may have benefits for defect-free resonant clocks). This approach for a clock region 200, which is comprised primarily of a plurality of sectors 202, reduces test circuit overhead because the cost of one or more test circuits 100 is amortized across each of the multiplicity of resonant clock circuits 106.

As shown in FIG. 2, the functionality of the test circuit 100 in this embodiment is divided into a test stimulus circuit 206 and a test observation circuit 208. The test stimulus circuit 206 may comprise at least portions of the driver circuit 104 and the signal generator 108 (FIG. 1A), and test observation circuit 208 may comprise at least portions of the threshold detection circuit 102 and associated logic gates. The test observation circuit 208 preferably further includes an additional latch to drive the Enable input of the threshold detection circuit 102, which replaces the function of OR gate 118 in the signal generator 108 (FIG. 1A).

It is to be appreciated that a given test stimulus circuit 206 and/or a given test observation circuit 208, forming at least a portion of test circuit 100, may be shared among multiple circuits to be tested (e.g., resonant clock circuits 106). The limit to which portions of the test circuits 100 can be shared will be a function of a resistance of the horizontal and vertical metal interconnect 204, a collective background leakage of the multiplicity of resonant clock circuits 106, as will be explained in further detail below with respect to FIG. 3, and/or a resolution of the threshold detection circuit 102, as will be explained in further detail below with respect to FIG. 4.

Figure 3:
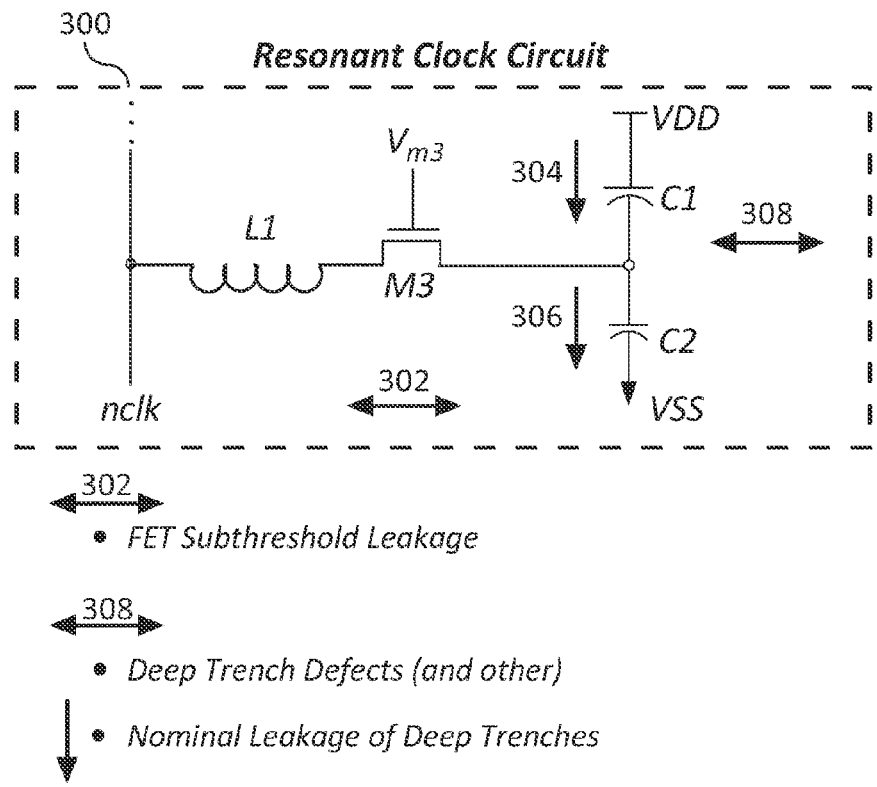
FIG. 3 is a schematic diagram depicts at least a portion of an illustrative resonant clock circuit to be tested by the exemplary test circuit shown in FIG. 1A, showing possible sources of leakage.

With reference now to FIG. 3, a schematic diagram depicts at least a portion of a resonant clock circuit 300 suitable for testing by the exemplary test circuit 100 shown in FIG. 1A. The resonant clock circuit 300 is used to conceptually illustrate possible sources of leakage which may occur during IC fabrication and/or design. As apparent from FIG. 3, for example, sources of potential leakage in the resonant clock circuit 300 include, but are not limited to, FET subthreshold leakage 302 attributable to NMOS transistor M3, nominal leakage of deep trenches 304 attributable to capacitor C1, nominal leakage of deep trenches 306 attributable to capacitor C2, and deep trench (and other) defects 308 attributable to capacitors C1 and C2.

Figure 4:
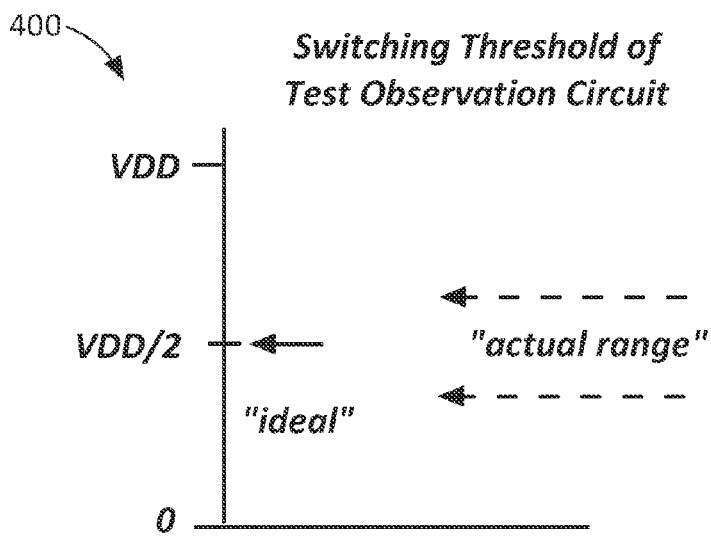
FIG. 4 conceptually illustrates an exemplary switching threshold corresponding to a design of a detection circuit suitable for use in the test circuit shown in FIG. 1A, according to an embodiment of the invention.

FIG. 4 conceptually illustrates an exemplary switching threshold corresponding to a design of a detection circuit (e.g., threshold detection circuit 102) suitable for use in the test circuit 100 shown in FIG. 1A, according to an embodiment of the invention. In this embodiment, an ideal switching threshold level for a test observation circuit (e.g., threshold detection circuit 102 shown in FIG. 1A) is VDD/2, although the actual switching threshold range may be a prescribed amount above or below the ideal switching threshold level arising, for example, as a result of transistor differences introduced by manufacturing. It is to be understood that the invention is not limited to any specific switching threshold level or switching threshold range.

Figure 5:
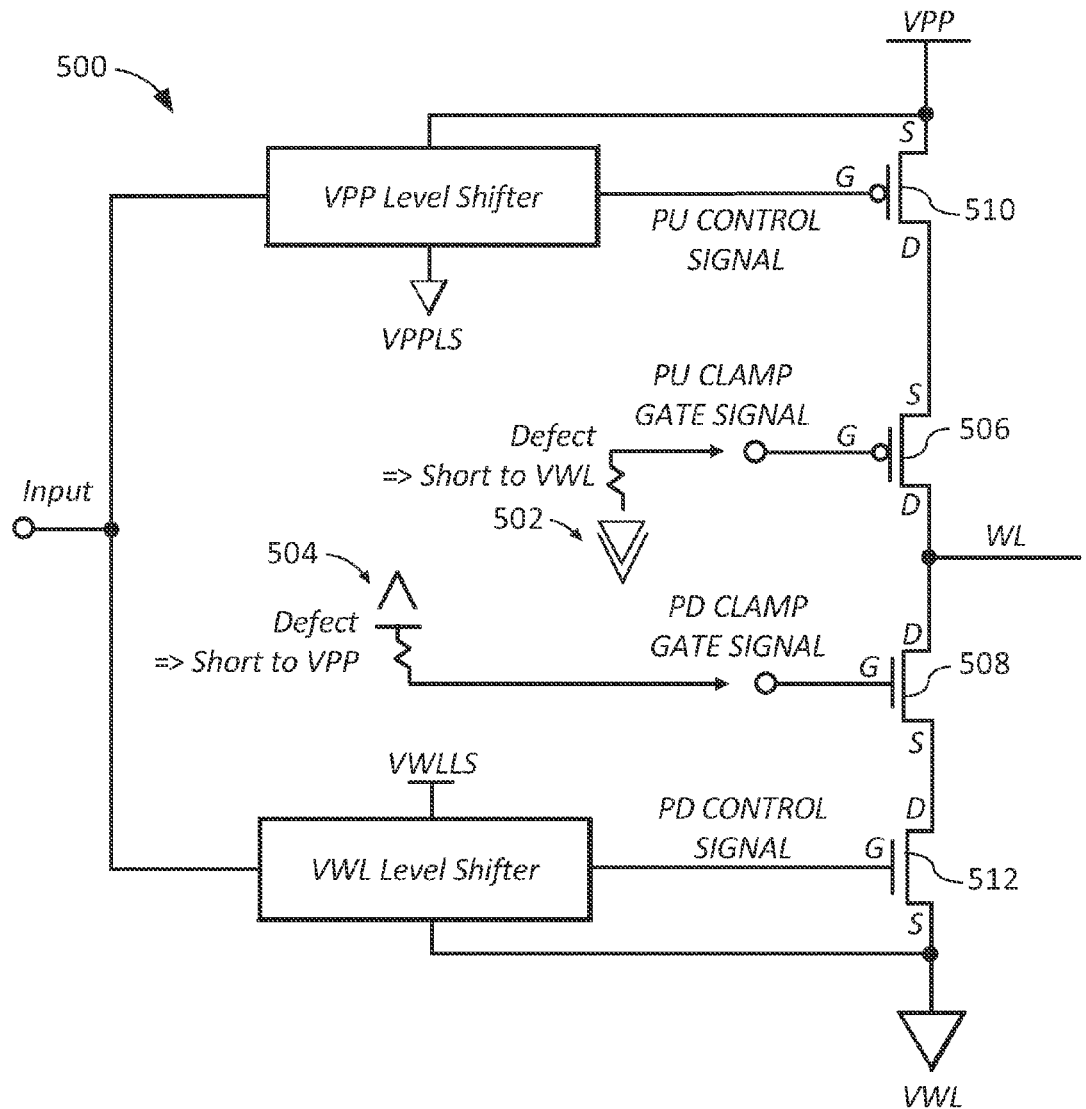
FIG. 5 is a schematic diagram depicting at least a portion of an exemplary word line driver circuit which includes shunting defects.

FIG. 5 is a schematic diagram depicting at least a portion of an exemplary word line driver circuit 500 (the operation of which is explained in detail in U.S. Pat. No. 8,120,968 to Reohr et al., which is incorporated herein by reference in its entirety for all purposes), suitable for use in an embedded dynamic random access memory (eDRAM), which as illustrated herein includes shunting defects. This circuit 500 can be used to conceptually illustrate the difficulty in detecting the presence of certain defects on analog circuit nodes using traditional approaches, and how techniques according to embodiments of the invention assist in detecting such otherwise hidden defects.

More particularly, consider the presence of shunting defects 502 and 504 in the exemplary word line driver circuit 500. In this illustrative scenario, the shunting defect 502 can be thought of as a defect in which a pull-up (PU) clamp voltage line (PU clamp gate signal), used to bias cascode PMOS transistor 506, is pulled low (e.g., to a low voltage supply VWL), thereby fully turning on transistor 506. Likewise, the shunting defect 504 can be thought of as a defect in which a pull-down (PD) clamp voltage line (PD clamp gate signal), used to bias cascode NMOS transistor 508, is pulled high (e.g., to a high voltage supply VPP), thereby fully turning on transistor 508.

Defects 502 and 504 impact the long-term reliability of the word line driver circuit 500, but not necessarily its function. Consequently, traditional testing methods (e.g., stuck-at testing) may not detect the presence of the shunting defects 502 and 504. If these shunting defects 502, 504 are present in the circuit 500, transistors 506 and 508 will turn on and experience potentially extreme voltages across their respective drain-gate and source-gate terminals well in excess of thin-oxide reliability guidelines established for the transistors; in essence, the voltage limiting function of the transistors 506 and 508 (as described in U.S. Pat. No. 8,120,968 referenced above) has been subverted. Moreover, drain-source terminals of transistors 510 and 512 also experience extreme voltages under such defect scenarios. Hence, transistors 506, 508, 510, and 512 have a high probability of failing over time. Whether the failure of transistors 506 and 508 can be uncovered or accelerated through burn-in screen or test, respectively, is unknown. It is noteworthy that only the pull-up test involving transistor M1 in the driver circuit 104 of FIG. 1A is required to test for the presence of the shunting defect 502, and only the pull-down test involving transistor M2 in the driver circuit 104 may be required to test the shunting defect 504.

Figure 6:
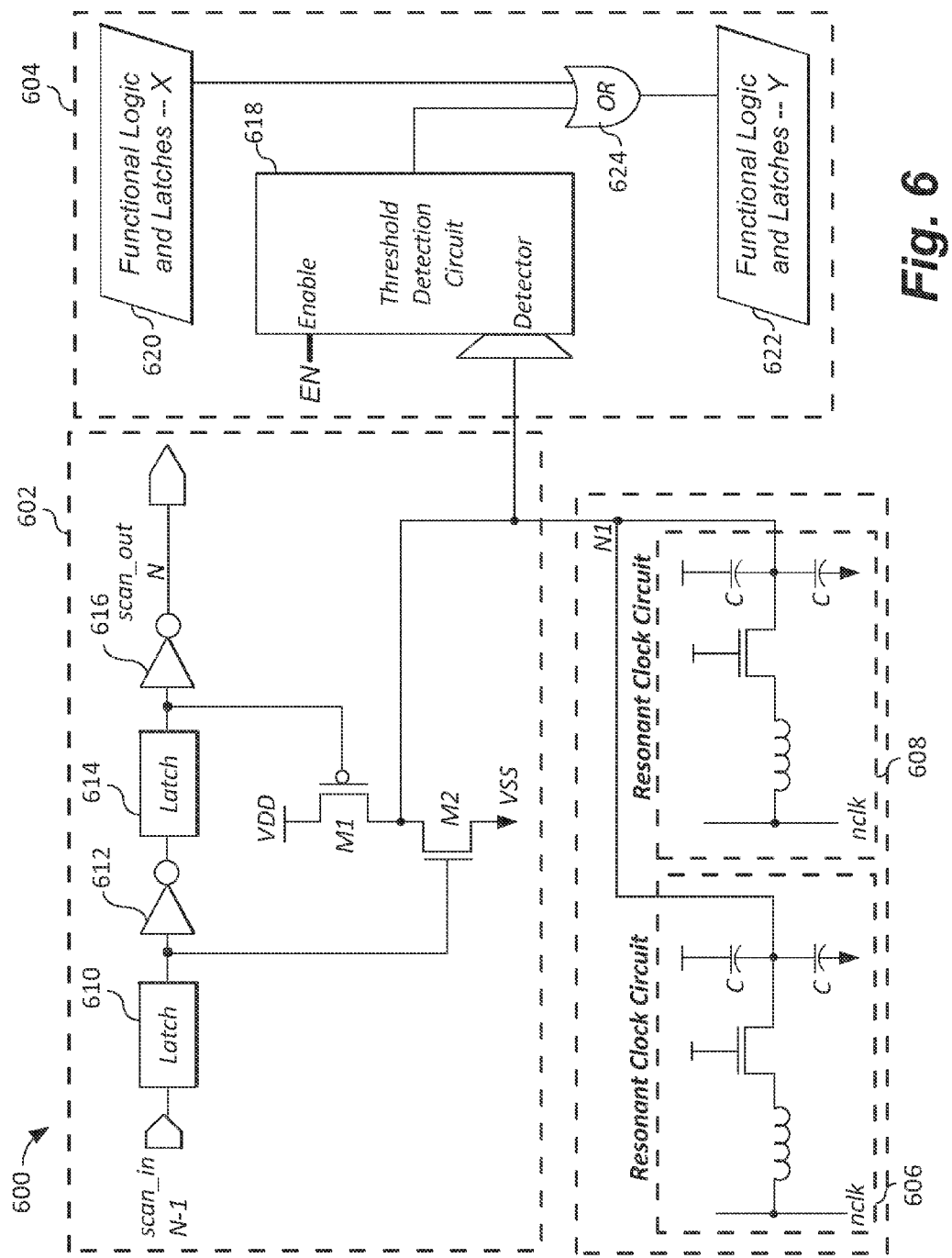
FIG. 6 is a schematic diagram depicting at least a portion of an exemplary test circuit, according to another embodiment of the invention.

In accordance with embodiments of the invention, a single test stimulus circuit and a single test observation circuit can be used to detect defects in multiple analog and/or digital circuits under test. With reference to FIG. 6, a schematic diagram depicts at least a portion of an exemplary test circuit 600, according to an embodiment of the invention. The test circuit 600 includes a test stimulus circuit 602, a test observation circuit 604, and a plurality of resonant clock circuits 606 and 608, or alternative circuits under test. The test stimulus circuit 602 is coupled with a circuit node N1 to be tested and includes a driver circuit comprising a pull-up stage, represented by PMOS transistor M1, and a pull-down stage, represented by NMOS transistor M2, connected together in a manner consistent with the driver circuit 104 shown in FIG. 1A. The test stimulus circuit 602 further includes a signal generator comprising a first latch 610, a first inverter 612, a second latch 614 and a second inverter 616 connected together in a manner consistent with the signal generator 108 shown in FIG. 1A. During a normal mode of operation, the signal generator is configured (e.g., by loading the latches 610 and 614 with the appropriate logic bits) such that transistors M1 and M2 are turned off.

The test observation circuit 604 includes a threshold detection circuit 618 having a signal input (Detector) coupled with the circuit node N1 to be monitored and a control input (Enable) adapted to receive a control signal, EN, supplied to the threshold detection circuit. The EN control signal is operative to disable the threshold detection circuit 618 in the normal mode of operation and to enable the threshold detection circuit during a test mode of operation. The test observation circuit 604 further includes first functional logic and latch circuitry 620 operative and second functional logic and latch circuitry 622 operative to at least, in part, temporarily store (for the purpose of test) an output of the threshold detection circuit 618 functionally ORed (e.g., via OR logic gate 624) with results of the adjacent preceding threshold detection circuit stored in the functional logic and latch circuitry 620. The test observation circuit 604 thus functions in a consistent manner during test with the threshold detection circuit 102 and corresponding logic (e.g., OR gate 103) shown in FIG. 1A. However, in contrast to FIG. 1A, this circuit 600 has been devised to collect results more in accordance with the test observation circuits 208 of FIG. 2. Results from the test of the resonant clock circuit are injected into a non-critical functional logic path (formed of circuits 620 and 622) anywhere on the chip through the OR gate 624.

In accordance with further aspects of the invention, in addition to detecting defects associated with characteristically capacitive circuit nodes, embodiments of the invention provide a mechanism for selectively disabling the circuit(s) under test. This is particularly beneficial when there is a plurality of circuits under test connected to a common node to be monitored, such as, for example, the distributed clock network 150 shown in FIG. 1B.

Figure 7:
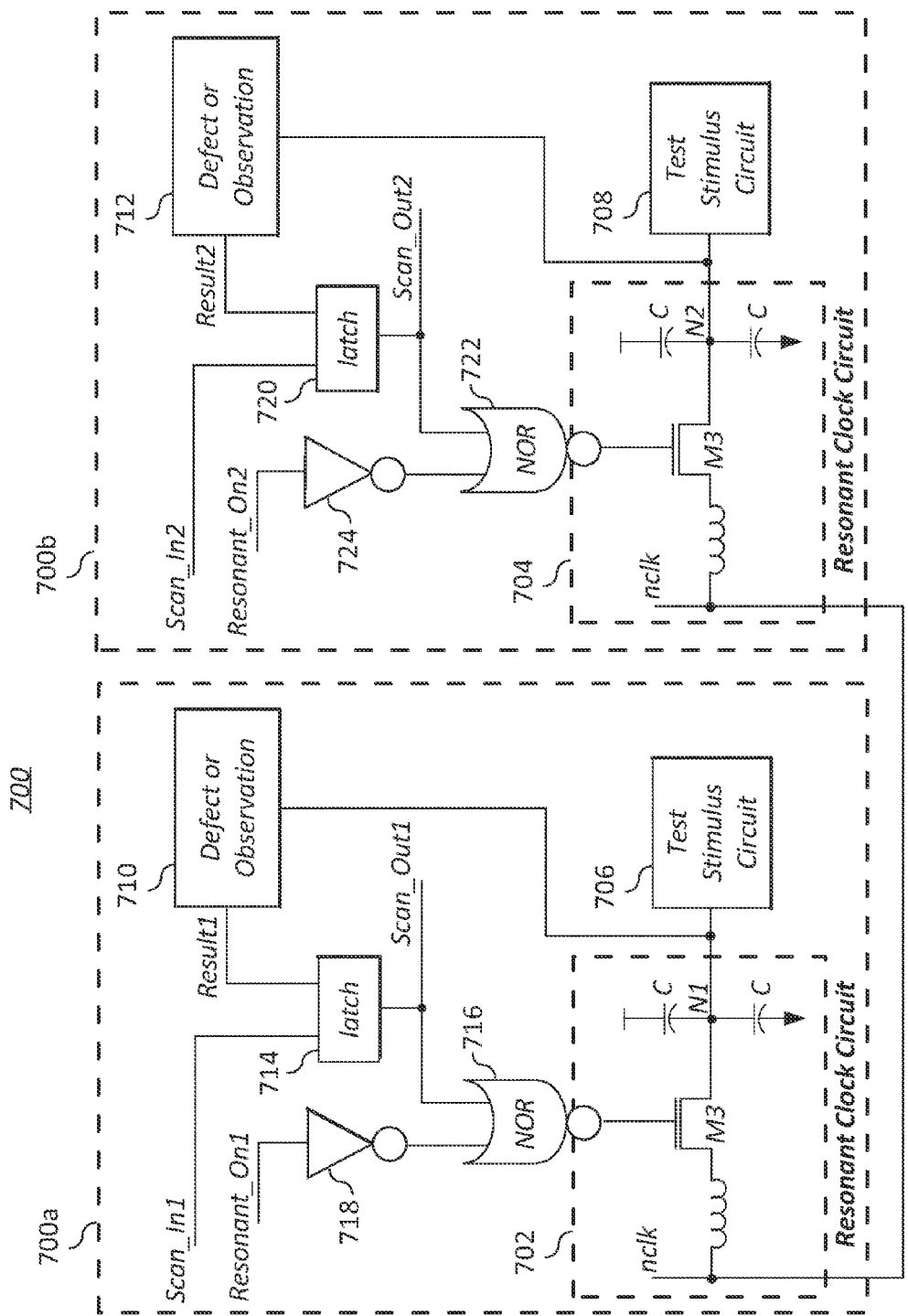
FIG. 7 is a schematic diagram depicting at least a portion of an exemplary test circuit operative to detect and disable a defective circuit and to characterize a resonant circuit, according to an embodiment of the invention.

With reference now to FIG. 7, a schematic diagram depicts at least a portion of an exemplary test circuit 700 which is operative to not only detect a defective analog or digital circuit under test, but is also operative to disable, or otherwise functionally isolate, such a circuit under test that is found to be defective. Test circuit 700 is shown as comprising independent first and second stages, 700a and 700b, respectively, although the invention is not limited to any specific number of test circuit stages. In this embodiment, the test circuit 700 is operative to test first and second circuits under test, which may be first and second resonant clock circuits 702 and 704, respectively. Each of the resonant clock circuits 702 and 704, in this embodiment, are implemented in a manner consistent with the resonant clock circuit 106 shown in FIG. 1A, although the invention is not limited to any specific circuit or circuit arrangement(s) under test. Moreover, in other embodiments in which there are multiple circuits under test, the circuits under test need not all be the same.

The first stage 700a includes a first test stimulus circuit 706 connected with a first circuit node, N1, in the first resonant clock circuit 702 to be tested, and the second stage 700b includes a second test stimulus circuit 708 connected with a second circuit node, N2, in the second resonant clock circuit 704 to be tested. Each of the first and second test stimulus circuits 706 and 708, respectively, preferably includes a driver circuit and corresponding signal generation circuitry which may be implemented in a manner consistent with the driver circuit 104 and signal generator 108 shown in FIG. 1A, although alternative circuit arrangements for generating a test stimulus for detecting a defect in a corresponding circuit under test are similarly contemplated by the invention.

Test stage 700a further includes a first defect or observation circuit 710 coupled with the first node N1 to be monitored and test stage 700b includes a second defect or observation circuit 712 coupled with the second node N2 to be monitored. Each of first and second observation circuits 710 and 712, respectively, comprises a threshold detection circuit and corresponding logic circuitry which may be implemented in a manner consistent with the threshold detection circuit 102 and OR gate 103 shown in FIG. 1A, although alternative circuit arrangements for detecting a defect in the corresponding circuit under test are similarly contemplated, as will become apparent to those skilled in the art given the teachings herein.

As previously explained in conjunction with FIG. 1A, during a test mode of operation, the test stimulus circuits 706 and 708 are operative to weakly drive the corresponding circuit nodes N1 and N2, respectively, under test. The test observation circuits 710 and 712 are operative to determine whether or not voltage levels on the circuit nodes N1 and N2, respectively, are less than (or more than, depending upon the type of test) corresponding prescribed threshold levels, and thereby detect the presence of a defect in the corresponding circuits 702 and 704, respectively, under test. The test observation circuits are operative to generate corresponding output signals indicative of the detection result. Specifically, the first observation circuit 710 is operative to generate an output signal, Result1, indicative of whether or not there is a defect in the first circuit 702 under test. Similarly, the second observation circuit 712 is operative to generate an output signal, Result2, indicative of whether or not there is a defect in the second circuit 704 under test.

Once a defect is found, a switch in each of the resonant clock circuits 702 and 704 under test, implemented in this embodiment as an NMOS transistor M3, is turned off, thereby disabling the circuit from the overall clock distribution network nclk. To accomplish this, each of the resonant clock circuits receives a corresponding control signal, supplied to the gate of transistor M3, generated, in this embodiment, as a function of the test observation circuit result and/or a corresponding enable signal supplied to each test stage 700a, 700b. More particularly, with reference to the first resonant clock circuit 702, the output Result1 generated by the first observation circuit 710 is supplied to a first input of a first latch 714. A second input of the latch 714 is adapted to receive an input signal, Scan_In1, used for selecting (e.g., programming) a given one of the resonant clock circuits under test. An output signal, Scan_Out1, generated by the latch 714 is supplied to a first input of a first NOR gate 716. A second input of the NOR gate 716 is adapted to receive a local enable signal, which in this embodiment is a logical complement of a control signal Resonant_On1. The NOR gate 716 functions to logically OR the result of the test observation circuit 710 with the local enable signal, such that either one of the control signals can disable the resonant clock circuit 702. The NOR gate 716 is operative to generate the control signal supplied to the gate of transistor M3 in the resonant clock circuit 702 used to selectively disable the resonant clock circuit 702.

Likewise, with reference to the second resonant clock circuit 704, the output Result2 generated by the second test observation circuit 712 is supplied to a first input of a second latch 720. A second input of the latch 720 is adapted to receive an input signal, Scan_In2, used for selecting (e.g., programming) a given one of the resonant clock circuits under test. Assuming stages 700a and 700b are adjacent stages forming at least a portion of a scan chain, the output signal Scan_Out1 generated by latch 714 can be utilized as the input signal Scan_In2 suppled to latch 720. An output signal, Scan_Out2, generated by the latch 720 is supplied to a first input of a second NOR gate 722. A second input of the NOR gate 722 is adapted to receive a local enable signal, which in this embodiment is a logical complement of a control signal Resonant_On2. The NOR gate 722 functions to logically OR the result of the test observation circuit 712 with the local enable signal. The NOR gate 722 is operative to generate the control signal supplied to the gate of transistor M3 in the resonant clock circuit 704 used to selectively disable the resonant clock circuit 704.

Each of the latches 714 and 720, in this embodiment, serves several functions; namely, to collect and store test results from the corresponding defect or observation circuit 710 and 712, respectively, to permit selective disabling of the switch transistor M3 in the corresponding resonant clock circuit 702 and 704, respectively, either in a temporary manner (e.g., for product characterization) or in a permanent manner (e.g., for a product having a defective resonant clock circuit), and to act as an independent memory element forming the scan chain, in which each latch can be individually programmed to a different state and through which may flow results collected from tests of other resonant clock circuits or through which may flow patterns to program the resonant clock circuit. Thus, in an LSSD application, the output signal (e.g., Scan_Out1) of a latch in a given test stage (e.g., 700a) may form the input signal (e.g., Scan_In2) of an adjacent proceeding test stage (e.g., 700b) to thereby form a shift register, which enables the aforementioned collection of results and assertions of patterns.

In accordance with another embodiment, in certain applications, the test circuit can be modified to eliminate dedicated test observation circuit(s) (e.g., threshold detection circuit 102 and corresponding logic circuitry 103 shown in FIG. 1, or test observation circuits 710 and 712 shown in FIG. 7), thereby reducing test circuit overhead. By way of example only and without loss of generality, consider an illustrative test circuit 800 according to an embodiment of the invention that is operative to detect defects in a word line driver circuit 802, as shown in FIG. 8.

In addition, as discussed previously in conjunction with FIG. 5, the presence of a defect 502 (e.g., a reliability defect) does not render the word line driver circuit 500 non-functional but, rather, continues to enable the word line driver circuit 500. During normal operation, the presence of defect 502 causes voltages applied across the terminals of transistors 506 and 510 to exceed the reliability limits of operation for the transistors. Eventually, one of the transistors 506 and 510 may fail causing an undesirable field failure in a system.

Figure 8:
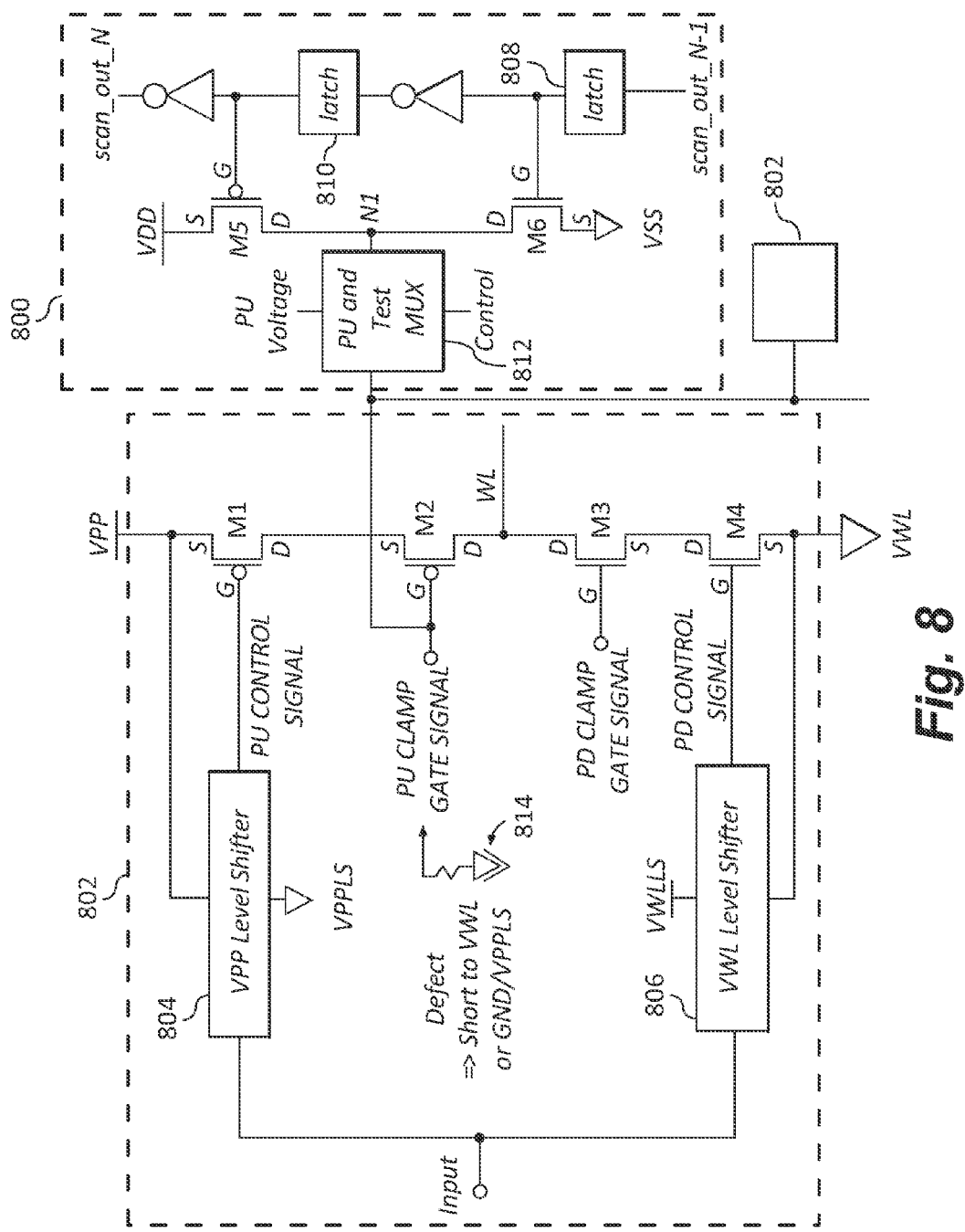
FIG. 8 is a schematic diagram depicting at least a portion of an exemplary an test circuit operative to detect defects in a word line driver circuit under test, according to an embodiment of the invention.

The aforementioned test circuit simplifications and reliability problems are described in further detail with respect to FIG. 8. With reference now to FIG. 8, the word line driver circuit 802 includes a pull-up output stage comprising a first PMOS transistor M1 and a second PMOS transistor M2 connected in a cascode arrangement. Specifically, a source of transistor M1 is adapted for connection with a first voltage supply, VPP, a drain of M1 is connected with a source of transistor M2, a gate of M1 is adapted to receive a first control signal, which may be a pull-up (PU) control signal, a drain of M2 is connected with a corresponding word line (WL), and a gate of M2 is adapted to receive a first bias signal, which may be a PU clamp gate signal. The PU control signal is generated by a first level shift circuit 804, which may be a VPP level shifter. VPP level shifter 804 is operative to receive an input signal, Input, referenced to a first set of voltage levels (e.g., VDD and VSS) and to generate the PU control signal referenced to a second set of voltage levels, VPP and VPPLS.

The word line driver circuit 802 further includes a pull-down output stage comprising first NMOS transistor M3 and second NMOS transistor M4 connected in a cascode arrangement. Specifically, a source of transistor M4 is adapted for connection with a second voltage supply, VWL, a drain of M4 is connected with a source of transistor M3, a gate of M4 is adapted to receive a second control signal, which may be a pull-down (PD) control signal, a drain of M3 is connected with the corresponding word line (WL), and a gate of M3 is adapted to receive a second bias signal, which may be a PD clamp gate signal. The PD control signal is generated by a second level shift circuit 806, which may be a VWL level shifter. VWL level shifter 806 is operative to receive the input signal, Input, referenced to the first set of voltage levels (e.g., VDD and VSS) and to generate the PD control signal referenced to a third set of voltage levels, VWLLS and VWL.

The test circuit 800 is configured, in this embodiment, to monitor the voltage on the gate of transistor M2 to determine whether or not transistor M2 is functional. As apparent from FIG. 8, the test circuit 800 does not include a test observation circuit (e.g., threshold detection circuit 102 shown in FIG. 1A). Rather, the word line itself is, in conjunction with a plurality of memory cells (not explicitly shown) coupled to the word line, used as the test observation circuit, thereby eliminating the need for the test observation circuitry. Thus, test circuit 800 includes a test stimulus circuit comprising a pull-up stage, implemented as a PMOS transistor M5, and a pull-down stage, implemented as an NMOS transistor M6, along with corresponding control signal circuitry. More particularly, a source of transistor M5 is adapted for connection to VDD, or alternative voltage supply, a drain of M5 is connected with a drain of transistor M6 at node N1, a source of M6 is adapted for connection to VSS or ground, a gate of M5 is adapted to receive a first control signal, and a gate of M6 is adapted to receive a second control signal.

The test circuit 800 further includes signal generation circuitry for generating the first and second control signals. Specifically, a first latch 808 is adapted to receive an input signal, scan_in_N−1, supplied by an adjacent preceding latch stage (not explicitly shown) and is operative to generate the second control signal. A second latch 810 is adapted to receive a logical complement of the output of the first latch 808 and to generate the first control signal. A logical complement of the output of latch 810 forms an output signal, scan_out_N, which is supplied to an adjacent subsequent latch stage (not explicitly shown).

The test circuit 800 further includes a multiplexer 812 connected with the pull-up and pull-down driver stages at node N1 and adapted to generate the output test stimulus supplied to the circuit node to be monitored, in this embodiment, the gate of transistor M2 in the word line driver circuit 802 under test. During normal operation, the multiplexer 812 is adapted to apply the correct PU voltage (pull-up voltage) to the word line driver circuit 802. It will now be explained how the word line itself functions as the test observation circuit operative to indicate a defective circuit.

Assuming, for example, a shunting defect 814 on the gate of transistor M2, the driver circuitry in test circuit 800 may not be able to overdrive the defect, and thus M2 will not be turned off during test, even though it is expected to be turned off in the defect-free case. In this defective instance (during test), the word line driver circuit 802 remains functional, and hence the voltage on the word line WL may be high (i.e., when an appropriate address is applied to select the word line driver circuit). If the word line goes high in this test case, it indicates a reliability defect 814 may be present on the PU clamp gate signal line. Because the word line driver circuit 802 can function due to the presence of the defect 814, during test, memory cells (not explicitly shown) attached to the word line driver circuit 802 can be written, and hence a reliability defect 814 is indicated. If the memory cells are not written because the word line driver circuit 802 is rendered non-functional during test, the circuit is considered defect-free.

It is beneficial to summarize some differences between testing the resonant clock circuit (106 in FIG. 1A or 152 in FIG. 1B) and the word line driver circuit 500 (FIG. 5). In testing the resonant clock circuit, a stuck-at-fault test is performed. In the defect-free case, the output of the defect-free circuit should logically reflect the weak "pull-up" or "pull-down" state induced by transistors M1 and M2, respectively, in the driver circuit 104 (FIG. 1A). If the output is opposite (i.e., incorrect), then the node N1 is "stuck at" the opposite logic state relative to the applied "pull-up" or "pull-down" logic state (test stimulus). In testing the word line driver circuit 500, which tests for reliability defects, the opposite result is expected, in some sense. Specifically, during test, a defect-free word line driver circuit is driven into a non-functioning state. If our circuit functions, then a reliability defect is determined to be present in the word line driver circuit.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in essentially any application and/or electronic system in which it is desirable to detect defects in an analog and/or digital circuit having a characteristically capacitive node. Suitable systems for implementing techniques of the invention may include, but are not limited to, personal computers, memory systems (embedded or otherwise), communication networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A test circuit for detecting a leakage defect in at least a first circuit under test, the test circuit comprising:
    at least a first test stimulus circuit operative to drive an otherwise defect-free, characteristically capacitive node in the first circuit under test to a prescribed voltage level; and
    at least a first observation circuit having at least one threshold and adapted for connection with at least one node in the first circuit under test, the observation circuit being operative to detect a voltage level of the at least one node in the first circuit under test and to generate an output signal indicative of whether the voltage level of the at least one node is less than the at least one threshold;
    wherein the voltage level of the at least one node in the first circuit under test being less than the at least one threshold is indicative of a first type of leakage defect in the first circuit under test, and wherein the voltage level of the at least one node in the first circuit under test being greater than the at least one threshold is indicative of a second type of leakage defect in the first circuit under test.

2. The test circuit of claim 1, wherein the first test stimulus circuit comprises a driver circuit including a pull-up stage and a pull-down stage, each of the pull-up and pull-down stages being adapted for connection with the at least one node in the first circuit under test.

3. The test circuit of claim 2, wherein a drive strength of the pull-down stage is selected to be less than a pull-up strength associated with an anticipated pull-up defect in the first circuit under test.

4. The test circuit of claim 2, wherein a drive strength of the pull-up stage is selected to be less than a pull-down strength associated with an anticipated pull-down defect in the first circuit under test.

5. The test circuit of claim 2, wherein the pull-down stage comprises at least one NMOS transistor having a first source/drain adapted for connection with a voltage return of the test circuit, a second source/drain adapted for connection with the at least one node in the first circuit under test, and a gate adapted to receive a first control signal, the NMOS transistor being selectively activated as a function of the first control signal.

6. The test circuit of claim 2, wherein the pull-up stage comprises at least one PMOS transistor having a first source/drain adapted for connection with a voltage supply of the test circuit, a second source/drain adapted for connection with the at least one node in the first circuit under test, and a gate adapted to receive a first control signal, the PMOS transistor being selectively activated as a function of the first control signal.

7. The test circuit of claim 2, wherein the first test stimulus circuit further comprises a signal generator circuit operative to generate at least first and second control signals for selectively controlling the pull-down and pull-up stages, respectively.

8. The test circuit of claim 7, wherein the signal generator circuit is operative to generate a third control signal for selectively enabling the first observation circuit.

9. The test circuit of claim 7, wherein the signal generator circuit comprises at least first and second latches coupled together to form adjacent stages of a series scan chain such that an input of the second latch is adapted to receive a signal indicative of an output of the first latch, the first control signal being generated as the output of the first latch, the second control signal being generated as an output of the second latch.

10. The test circuit of claim 9, wherein the signal generator circuit is operative to generate a third control signal for selectively enabling the first observation circuit, the third control signal being generated as a logical OR of the output of the first latch and a signal indicative of the output of the second latch.

11. The test circuit of claim 1, wherein at least one of the first test stimulus circuit and the first observation circuit is disabled during a normal mode of operation of the first circuit under test.

12. The test circuit of claim 1, wherein the first observation circuit comprises a threshold detection circuit operative to receive a voltage on the at least one node in the first circuit under test and to generate an output result indicative of whether the voltage on the at least one node in the first circuit under test is one of less than, equal to and greater than the at least one threshold.

13. The test circuit of claim 1, further comprising a first switch circuit operative to selectively disable the first circuit under test as a function of at least one of a first control signal supplied to the test circuit and the output signal generated by the first observation circuit.

14. The test circuit of claim 1, wherein the first circuit under test comprises a resonant clock circuit.

15. The test circuit of claim 1, further comprising:
a second test stimulus circuit operative to drive an otherwise defect-free, characteristically capacitive node in a second circuit under test to a prescribed voltage level; and
a second observation circuit having at least one threshold and adapted for connection with at least one node in the second circuit under test, the second observation circuit being operative to detect a voltage level of the at least one node in the second circuit under test and to generate an output signal indicative of whether the voltage level of the at least one node is less than the at least one threshold;
wherein the voltage level of the at least one node in the second circuit under test being less than the at least one threshold is indicative of a first type of leakage defect in the second circuit under test, and wherein the voltage level of the at least one node in the second circuit under test being greater than the at least one threshold is indicative of a second type of leakage defect in the second circuit under test.

16. The test circuit of claim 15, further comprising:
a first latch having a first input adapted to receive the output signal generated by the first observation circuit, a second input adapted to receive a first control signal, and an output operative to generate an output result, the first circuit under test being selectively disabled as a function of the output result generated by the first latch; and
a second latch having a first input adapted to receive the output signal generated by the second observation circuit, a second input adapted to receive a second control signal, and an output operative to generate an output result, the second circuit under test being selectively disabled as a function of the output result generated by the second latch.

17. The test circuit of claim 16, wherein the second control signal supplied to the second latch comprises the output result generated by the first latch.

18. The test circuit of claim 16, wherein the first and second latches form at least a portion of series scan chain.

19. The test circuit of claim 16, wherein each of the first and second circuits under test comprises a resonant clock circuit including a decoupling node, and wherein the decoupling nodes in the first and second circuits under test are connected together.

20. The test circuit of claim 19, wherein the decoupling nodes of the first and second circuits under test form at least a portion of a clock distribution network.

21. The test circuit of claim 1, wherein the first test stimulus circuit and the first observation circuit are adapted for connection with at least a second circuit under test, the first test stimulus circuit being operative to drive an otherwise defect-free, characteristically capacitive node in the second circuit under test to the prescribed voltage level, the test circuit comprising selection circuitry operative to disable at least one of the first and second circuits under test.

22. The test circuit of claim 21, wherein the respective characteristically capacitive nodes in the first and second circuits under test are coupled together, and the first and second circuits under test are non-proximate relative to one another.

23. An integrated circuit comprising one or more test circuits for detecting leakage defects in one or more corresponding circuits under test, each of at least a subset of the one or more test circuits comprising:
at least a first test stimulus circuit operative to drive an otherwise defect-free, characteristically capacitive node in a circuit under test to a prescribed voltage level; and
at least a first observation circuit having at least one threshold and adapted for connection with at least one node in the circuit under test, the observation circuit being operative to detect a voltage level of the at least one node in the circuit under test and to generate an output signal indicative of whether the voltage level of the at least one node is less than the at least one threshold;
wherein the voltage level of the at least one node in the circuit under test being less than the at least one threshold is indicative of a first type of leakage defect in the circuit under test, and wherein the voltage level of the at least one node in the circuit under test being greater than the at least one threshold is indicative of a second type of leakage defect in the circuit under test.

* * * * *